United States Patent
Sakai et al.

(10) Patent No.: US 9,577,122 B2
(45) Date of Patent: Feb. 21, 2017

(54) CONDUCTIVE PASTE-FORMING ELECTRODE, SOLAR CELL MANUFACTURING METHOD AND SOLAR CELL

(71) Applicant: NAMICS CORPORATION, Niigata-shi, Niigata (JP)

(72) Inventors: Noriyuki Sakai, Niigata (JP); Taeko Semba, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

(21) Appl. No.: 14/782,180

(22) PCT Filed: Mar. 6, 2014

(86) PCT No.: PCT/JP2014/055716
§ 371 (c)(1),
(2) Date: Oct. 2, 2015

(87) PCT Pub. No.: WO2014/162818
PCT Pub. Date: Oct. 9, 2014

(65) Prior Publication Data
US 2016/0049532 A1    Feb. 18, 2016

(30) Foreign Application Priority Data

Apr. 4, 2013 (JP) .................... 2013-078363

(51) Int. Cl.
*H01B 1/22* (2006.01)
*H01L 31/0368* (2006.01)
(Continued)

(52) U.S. Cl.
CPC ......... *H01L 31/022425* (2013.01); *H01B 1/22* (2013.01); *H01L 31/028* (2013.01);
(Continued)

(58) Field of Classification Search
CPC .. H01B 1/22; H01L 31/022441; H01L 31/028; H01L 31/036; H01L 31/03682; H01L 31/18; Y02E 10/50
(Continued)

(56) References Cited

U.S. PATENT DOCUMENTS

2008/0230119 A1    9/2008   Akimoto
2011/0192456 A1*   8/2011   Hang .................. C03C 8/02
                                                       136/256

(Continued)

FOREIGN PATENT DOCUMENTS

JP         05258918 A        10/1993
JP       H05258918 A    *    10/1993

(Continued)

OTHER PUBLICATIONS

International Search Report (ISR) dated Apr. 15, 2014 issued in International Application No. PCT/JP2014/055716.

*Primary Examiner* — Harold Pyon
*Assistant Examiner* — Danny N Kang
(74) *Attorney, Agent, or Firm* — Holtz, Holtz & Volek PC (57) ABSTRACT

A conductive paste is provided which can form electrodes in crystalline silicon solar cells at low cost while ensuring that the electrodes exhibit low contact resistance with respect to both p-type and n-type impurity diffusion layers. The conductive paste for forming a solar cell electrode includes a silver powder, a glass frit, an additive particle and an organic vehicle, the glass frit having a glass transition point of 150 to 440° C., the additive particle including an alloy material containing 20 to 98 mass % aluminum, the conductive paste including the additive particle in an amount of 2 to 30 parts by weight with respect to 100 parts by weight of the silver powder.

11 Claims, 2 Drawing Sheets

(51) Int. Cl.
   *H01L 31/0224*   (2006.01)
   *H01L 31/028*    (2006.01)
   *H01L 31/036*    (2006.01)
   *H01L 31/18*     (2006.01)

(52) U.S. Cl.
   CPC .... *H01L 31/022441* (2013.01); *H01L 31/036* (2013.01); *H01L 31/03682* (2013.01); *H01L 31/18* (2013.01); *Y02E 10/50* (2013.01)

(58) Field of Classification Search
   USPC ........................................................ 252/500
   See application file for complete search history.

(56) References Cited

U.S. PATENT DOCUMENTS

2012/0142140 A1* 6/2012 Li .................... H01L 31/02244
                                                                    438/98
2012/0260988 A1* 10/2012 Adachi ................... H01B 1/22
                                                                    136/261

FOREIGN PATENT DOCUMENTS

| JP | 08148447 A | | 6/1996 |
| JP | 2008135565 A | * | 6/2008 |
| JP | 2009087957 A | | 4/2009 |
| JP | 2011171442 A | | 9/2011 |
| WO | 2011097606 A2 | | 8/2011 |

* cited by examiner

CONDUCTIVE PASTE-FORMING ELECTRODE, SOLAR CELL MANUFACTURING METHOD AND SOLAR CELL

TECHNICAL FIELD

The present invention relates to a conductive paste for forming a solar cell electrode, in particular, to a conductive paste for forming surface or back surface electrodes in crystalline silicon solar cells having crystalline silicon substrates such as monocrystalline silicon or polycrystalline silicon, to a solar cell manufacturing method using the conductive paste for forming an electrode, and to a solar cell produced by the manufacturing method. In particular, the invention relates to a conductive paste for forming electrodes in back-contact crystalline silicon solar cells, to a solar cell manufacturing method using the conductive paste for forming an electrode, and to a solar cell produced by the manufacturing method.

BACKGROUND ART

In recent years, there has been a significant increase in the production of crystalline silicon solar cells that use plates of monocrystalline silicon or polycrystalline silicon as crystalline silicon substrates. Such solar cells have electrodes through which the generated electricity is extracted. In the conventional crystalline silicon solar cells, the electrodes are formed using conductive pastes containing conductive powders, glass frits, organic binders, solvents and other additives.

For example, Patent Document 1 describes a conductive paste used in the formation of electrodes on p-type silicon semiconductor substrates. This conductive paste includes 60 to 90 wt % of solids and 10 to 40 wt % of an organic vehicle based on the weight of the whole of the paste, the solids including 85 to 98.5 wt % of a silver powder, 0.5 to 10 wt % of an aluminum powder, and 1 to 10 wt % of a glass frit based on the weight of the whole of the solids.

Patent Document 2 describes a solar cell having a silicon semiconductor substrate (1), a surface-side diffusion layer (2) on the substrate, and an electrode (4) formed in contact with the diffusion layer by the application and heat treatment of a conductive paste (3) in which the main material includes at least one of silver and copper. This solar cell is characterized in that an aluminum-silicon alloy is added to the main material of the conductive paste (3).

Patent Document 3 describes a conductive paste for back-contact solar cells. Specifically, Patent Document 3 describes that the conductive paste includes (a) conductive particles including silver particles, and additive particles selected from (i) metal particles selected from the group consisting of Mo, Tc, Ru, Rh, Pd, W, Re, Os, Ir and Pt particles, (ii) alloys including the above metal particles and (iii) particles loaded with the above metal particles, (b) a glass frit, and (c) a resin binder. The additive particles additionally used in the conductive paste of Patent Document 3 are relatively expensive metals.

For example, the glass frit used in conductive pastes for the formation of electrodes in the conventional solar cells, in particular crystalline silicon solar cells, is lead borosilicate glass frit containing lead oxide.

PRIOR ART DOCUMENTS

Patent Documents

Patent Document 1: Japanese Patent Application Kokai Publication No. H8-148447

Patent Document 2: Japanese Patent Application Kokai Publication No. 2009-87957

Patent Document 3: U.S. patent application Ser. No. 2008/0230119

SUMMARY OF THE INVENTION

Problems to be Solved by the Invention

The reduction of electrical resistance (contact resistance) between an electrode and an impurity diffusion layer (an emitter layer) in crystalline silicon is an important challenge in order to obtain crystalline silicon solar cells having high conversion efficiency.

Figure 2:
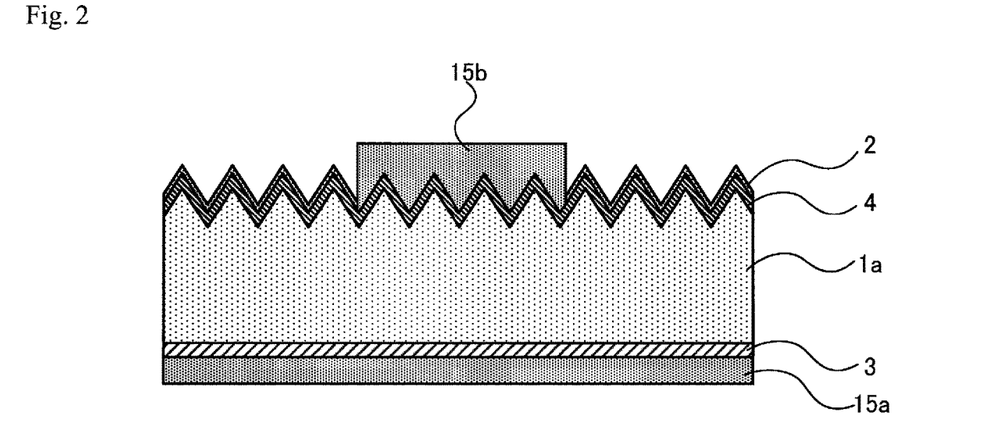
FIG. 2 is a schematic sectional view of a crystalline silicon solar cell having electrodes on both a light incident surface and a backside surface.

As an example, a schematic sectional view of a conventional crystalline silicon solar cell is illustrated in FIG. 2. In the example of crystalline silicon solar cells illustrated in FIG. 2, an n-type diffusion layer (an n-type silicon layer) 4 is formed on the light incident surface of a p-type crystalline silicon substrate 1a. An antireflection layer 2 is formed on the n-type diffusion layer 4. Further, a pattern of an light incident-side electrode 15b (a front surface electrode) is printed on the antireflection layer 2 by the application of a conductive paste by a method such as screen printing, and the conductive paste is dried and fired to form the light incident-side electrode 15b. During the firing, the conductive paste fires through the antireflection layer 2 and consequently the light incident-side electrode 15b may be formed in contact with the n-type diffusion layer 4. The firing-through is a process in which the antireflection layer that is an insulating film is etched by a component such as glass frits present in the conductive paste to form an electrical conduction between the light incident-side electrode 15b and the n-type diffusion layer 4. Because the solar cell illustrated as an example in FIG. 2 does not require the incident of light through the backside surface of the p-type silicon substrate 1a, substantially the entire surface on the backside surface is covered with a back surface electrode 15a. A p-n junction is formed at the interface between the p-type silicon substrate 1a and the n-type diffusion layer 4. Light such as sunlight is transmitted through the antireflection layer 2 and the n-type diffusion layer 4 and is incident onto the p-type silicon substrate 1a. During this process, the light is absorbed and electron-hole pairs are generated. The electron-hole pairs are separated, by electric field of the p-n junction, into the electrons toward the light incident-side electrode 15b and the holes toward the back surface electrode 15a. The electrons and the holes are extracted as electric current to the outside through these electrodes.

Figure 1:
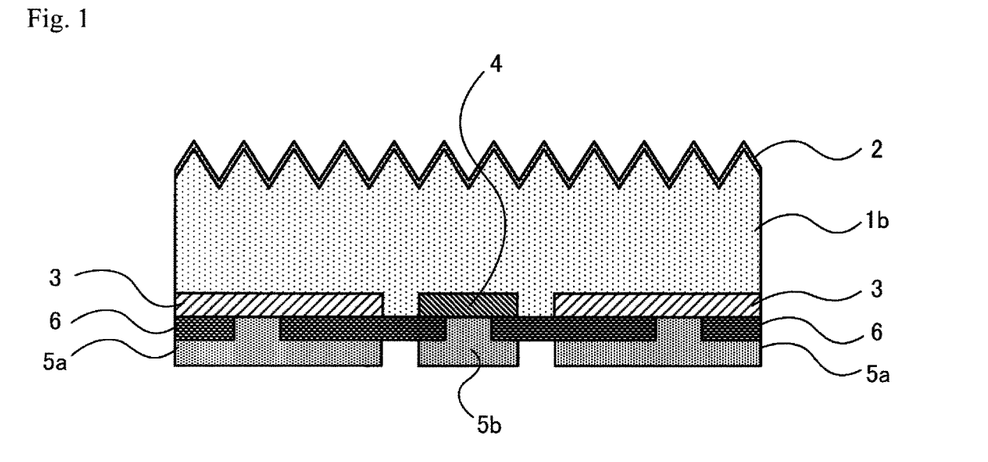
FIG. 1 is a schematic sectional view illustrating a back-contact crystalline silicon solar cell.

In recent years, back-contact solar cells such as one illustrated in FIG. 1 are under development. In a back-contact solar cell, as illustrated in FIG. 1, both positive and negative electrodes (a positive electrode 5a and a negative electrode 5b) are disposed on the backside surface of the solar cell (the surface opposite to the light incident surface). In the example illustrated in FIG. 1, a p-type diffusion layer (a p-type silicon layer) 3 and an n-type diffusion layer (an n-type silicon layer) 4 are disposed each in a comb-like pattern on the backside surface of an n-type crystalline silicon substrate 1b so that the teeth of the combs are arranged alternately. The positive electrode 5a and the negative electrode 5b are disposed in contact with the p-type diffusion layer 3 and the n-type diffusion layer 4, respectively.

In the case of a solar cell having electrodes on both sides of a substrate as illustrated in FIG. 2, the back surface electrode 15a and the front surface electrode 15b are generally formed of different conductive pastes. The reason for this is because the optimum components of a conductive paste that can form an electrode having low contact resistance with respect to the p-type diffusion layer 3 are generally different from the optimum components of a conductive paste that can form an electrode exhibiting low contact resistance with respect to the n-type diffusion layer 4. While the back surface electrode 15a and the front surface electrode 15b are formed by separate screen printing steps, the screen printing step has to be performed two times. Even if in the types of conductive pastes for forming the back surface electrode 15a and the front surface electrode 15b are different from each other, it does not make the solar cell manufacturing steps complicated. However, the availability of the same conductive paste in the formation of both the back surface electrode 15a and the front surface electrode 15b can eliminate the variation in the types of conductive pastes. That is, the back surface electrode 15a and the front surface electrode 15b may be formed using a single screen printing machine without the need of switching the types of conductive pastes. Consequently, the costs associated with the manufacturing of solar cells may be advantageously reduced.

In the case of a back-contact solar cell such as one illustrated in FIG. 1, both the positive electrode 5a and the negative electrode 5b are disposed on the backside. Thus, the availability of the same conductive paste in the formation of both the positive electrode 5a and the negative electrode 5b allows these electrodes to be formed by one screen printing step. Consequently, the costs associated with the manufacturing of solar cells may be advantageously reduced.

Further, the cost of conductive pastes may be reduced by using relatively inexpensive metal particles (metal powders) added to the conductive pastes, and thereby the costs associated with the manufacturing of solar cells may be advantageously reduced. Because the price of solar cells has been declined in recent years, the realization of inexpensive conductive pastes is very important.

It is therefore an object of the present invention to provide a conductive paste that can form electrodes in crystalline silicon solar cells at low cost while ensuring that the electrodes exhibit low contact resistance with respect to both p-type and n-type impurity diffusion layers.

Means for Solving the Problems

The present inventors have found that a conductive paste that includes a glass frit having a specific glass transition point Tg and additive particles of an alloy containing a specific amount of aluminum can form solar cell electrodes having low contact resistance with respect to both p-type and n-type impurity diffusion layers. The present invention has been completed based on the finding.

Aspects of the present invention reside in conductive pastes for forming solar cell electrodes characterized by the configurations 1 to 7 described below, methods for manufacturing crystalline silicon solar cells characterized by the configurations 8 to 10 described below, and crystalline silicon solar cells characterized by the configuration 11 described below.

(Configuration 1)

The configuration 1 of the invention is directed to a conductive paste for forming a solar cell electrode comprising a silver powder, a glass frit, an additive particle and an organic vehicle, the glass frit having a glass transition point of 150 to 440° C., the additive particle is an alloy material containing 20 to 98 mass % aluminum, the conductive paste comprising the additive particle in an amount of 2 to 30 parts by weight with respect to 100 parts by weight of the silver powder. The conductive paste of the invention can form electrodes in crystalline silicon solar cells at low cost while ensuring that the electrodes exhibit low contact resistance with respect to both p-type and n-type impurity diffusion layers.

(Configuration 2)

The configuration 2 of the invention is directed to a conductive paste according to the configuration 1, wherein the conductive paste includes the glass frit in an amount of 0.1 to 10 parts by weight with respect to 100 parts by weight of the silver powder. When the amount of the glass frit is in this specific range, the conductive paste of the invention can reliably form electrodes in crystalline silicon solar cells at low cost while ensuring that the electrodes exhibit low contact resistance with respect to both p-type and n-type impurity diffusion layers.

(Configuration 3)

The configuration 3 of the invention is directed to a conductive paste according to the configuration 1 or 2, wherein the material of the additive particle is silicon-aluminum alloy. When the material of the additive particle is silicon-aluminum alloy, the conductive paste of the invention can more reliably form electrodes in crystalline silicon solar cells at low cost while ensuring that the electrodes exhibit low contact resistance with respect to both p-type and n-type impurity diffusion layers.

(Configuration 4)

The configuration 4 of the invention is directed to a conductive paste according to the configuration 3, wherein the additive particle contains silicon in an amount of 0.1 to 20 parts by weight with respect to 100 parts by weight of aluminum in the additive particle. When the proportions of aluminum and silicon in the additive particle are in these specific ranges, the conductive paste of the invention can more reliably form electrodes in crystalline silicon solar cells at low cost while ensuring that the electrodes exhibit low contact resistance with respect to both p-type and n-type impurity diffusion layers.

(Configuration 5)

The configuration 5 of the invention is directed to a conductive paste according to the configuration 1 or 2, wherein the material of the additive particle is zinc-aluminum alloy. When the material of the additive particle is zinc-aluminum alloy, the conductive paste of the invention can more reliably form electrodes in crystalline silicon solar cells at low cost while ensuring that the electrodes exhibit low contact resistance with respect to both p-type and n-type impurity diffusion layers.

(Configuration 6)

The configuration 6 of the invention is directed to a conductive paste according to the configuration 5, wherein the additive particle contains zinc in an amount of 0.1 to 500 parts by weight with respect to 100 parts by weight of aluminum in the additive particle. When the proportions of aluminum and zinc in the additive particle are in these specific ranges, the conductive paste of the invention can more reliably form electrodes in crystalline silicon solar cells at low cost while ensuring that the electrodes exhibit low contact resistance with respect to both p-type and n-type impurity diffusion layers.

(Configuration 7)

The configuration 7 of the invention is directed to a conductive paste according to any one of the configurations 1 to 6, wherein the glass frit includes silver oxide and vanadium oxide. By using such a glass frit including silver oxide and vanadium oxide in the conductive paste of the invention, the contact resistance between the p-type and n-type impurity diffusion layers and the electrodes may be reduced highly reliably.

(Configuration 8)

The configuration 8 of the invention is directed to a method for manufacturing crystalline silicon solar cells including steps of printing the conductive paste described in any one of the configurations 1 to 7 onto a diffusion layer including n-type or p-type silicon in a crystalline silicon substrate, and forming an electrode by drying and firing the conductive paste. According to the method of the invention, crystalline silicon solar cells may be manufactured at low cost while ensuring that the electrodes exhibit low contact resistance with respect to both p-type and n-type impurity diffusion layers.

(Configuration 9)

The configuration 9 of the invention is directed to a method for manufacturing crystalline silicon solar cells according to the configuration 8, wherein the steps of forming the electrode include firing the conductive paste at 400 to 700° C. In the method for manufacturing crystalline silicon solar cells of the invention, forming the electrodes at the specific firing temperature makes it possible to produce solar cells that have electrodes exhibiting lower contact resistance with respect to both p-type and n-type impurity diffusion layers.

(Configuration 10)

The configuration 10 of the invention is directed to a method for manufacturing crystalline silicon solar cells according to the configuration 8 or 9, wherein the diffusion layers including n-type and p-type silicons are disposed on a backside surface of the crystalline silicon substrate opposite to a light incident surface. The method for manufacturing crystalline silicon solar cells of the invention may be applied to the production of back-contact solar cells. In this case, positive electrodes and negative electrodes may be formed using the same conductive paste, and the number of screen printing steps required to form the electrodes may be reduced to one time, thereby advantageously saving the costs for the manufacturing of solar cells. Thus, the method for manufacturing crystalline silicon solar cells of the invention may be suitably used for the production of back-contact solar cells.

(Configuration 11)

The configuration 11 of the invention is directed to a crystalline silicon solar cell produced by the manufacturing method described in any one of the configurations 8 to 9. According to the invention, positive electrodes and negative electrodes exhibiting low contact resistance may be formed using the single conductive paste, and thus the crystalline silicon solar cells may be obtained at low cost.

Effect of the Invention

The conductive pastes according to the present invention can form electrodes in crystalline silicon solar cells at low cost while ensuring that the electrodes exhibit low contact resistance with respect to both p-type and n-type impurity diffusion layers.

MODE FOR CARRYING OUT THE INVENTION

In the specification, the term "crystalline silicon" comprehends monocrystalline silicon and polycrystalline silicon. The term "crystalline silicon substrates" refers to materials formed into shapes such as crystalline silicon plates or other shapes suited for the formation of electric devices or electronic devices. Crystalline silicon may be produced by any methods without limitation. For example, monocrystalline silicon may be produced by the Czochralski process, and polycrystalline silicon may be produced by a casting process. Crystalline silicons produced by other methods are also usable as the crystalline silicon substrates, for examples, polycrystalline silicon ribbons formed by a ribbon lifting method, and polycrystalline silicon formed on dissimilar substrates such as glass.

The term "crystalline silicon solar cells" refers to solar cells fabricated using crystalline silicon substrates. As the indicators of solar cell characteristics, the conversion efficiency ($\eta$) obtained by the measurement of current-voltage characteristics under illumination, the open circuit voltage (Voc), the short circuit current (Isc) and the fill factor (hereinafter, also written as "FF") are generally used. Further, contact resistance that is the electrical resistance between an electrode and a diffusion layer (an emitter layer) in crystalline silicon is a general indicator used particularly in the evaluation of electrode performance The diffusion layer is a layer in which a p-type or n-type impurity is diffused at a higher concentration than the impurity concentration in the silicon substrate as the base.

Back-contact solar cells are a type of solar cells in which diffusion layers including p-type and n-type silicons in a crystalline silicon substrate (a p-type diffusion layer and an n-type diffusion layer), and a positive electrode and a negative electrode connected to these diffusion layers are all disposed on the backside surface opposite to the light incident surface. The absence of electrodes on the light incident surface of the back-contact solar cells is advantageous for the enhancement of solar cell efficiency because light may be allowed to be incident to the inside of the solar cells without any waste.

An aspect of the invention resides in a conductive paste for forming solar cell electrodes that includes a silver powder, a glass frit, additive particles of an alloy containing 20 to 98 mass % aluminum, and an organic vehicle. The alloy containing the prescribed amount of aluminum is preferably silicon-aluminum alloy or zinc-aluminum alloy. In the conductive paste of the invention, the glass transition point Tg of the glass frit is 150 to 440° C., preferably 150 to 430° C., and more preferably 150 to 300° C. The conductive paste of the invention includes the additive particles in an amount of 2 to 30 parts by weight, and preferably 3 to 20 parts by weight with respect to 100 parts by weight of the silver powder. The conductive paste of the invention can form electrodes in crystalline silicon solar cells to ensure that the resultant electrodes exhibit low contact resistance with respect to both p-type and n-type diffusion layers in which p-type and n-type impurities are diffused, with the same type of the conductive pastes.

Hereinbelow, the conductive paste of the invention will be described in detail.

The conductive paste of the invention includes a silver powder as a conductive powder. The silver powder is preferably used as a main component of the conductive powder. The conductive paste of the invention may include powders of metals other than silver, or powders of alloys of silver and other metals while ensuring that the performance of solar cell electrodes will not be impaired. In order to obtain low electrical resistance and high reliability, it is preferable that the conductive powder contain the silver powder in an amount of not less than 80 wt %, and more preferably not less than 90 wt % relative to the whole of the conductive powder, and it is still more preferable that the conductive powder be composed of the silver powder. The conductive powder may be substantially composed of the silver powder. That is, the conductive powder may include trace amounts of components other than silver that are inevitably mixed during production, while still achieving the advantageous effects of the invention.

The particle shape and the particle size of the conductive powder such as the silver powder are not particularly limited. Examples of the particle shapes include spheres and scales. The particle size refers to the largest length size of a single particle. From points of view such as workability, the particle size of the conductive powder is preferably 0.05 to 20 μm, and more preferably 0.1 to 5 μm.

Because the size of fine particles generally has a distribution, it is not necessary that all the particles have particle sizes falling in the above range. Preferably, the particle size at 50% of the cumulative distribution of the particle sizes of all the particles (average particle diameter: D50) is in the above range of particle sizes. The same applies to the size of particles described in the specification other than the conductive powder. The average particle diameter may be determined by measuring the particle size distribution by a Microtrack method (a laser diffraction scattering method) and determining the D50 value based on the particle size distribution obtained.

The size of the conductive powder such as the silver powder may also be expressed as a BET value (a BET specific surface area). The BET value of the conductive powder is preferably 0.1 to 5 m$^2$/g, and more preferably 0.2 to 2 m$^2$/g.

The conductive paste of the invention includes additive particles.

The conductive paste of the invention is characterized in that the material of the additive particles contains 20 to 98 mass % aluminum. The material of the additive particles is preferably silicon-aluminum alloy or zinc-aluminum alloy. By the conductive paste of the invention including such additive particles containing 20 to 98 mass % aluminum, the conductive paste of the invention can form electrodes that exhibit low contact resistance with respect to both p-type diffusion layers and n-type diffusion layers at low cost.

In the additive particles present in the conductive paste of the invention, the material of the additive particles is preferably silicon-aluminum alloy. In the silicon-aluminum alloy as the material of the additive particles, the content of silicon is preferably 0.1 to 20 parts by weight, more preferably 0.1 to 15 parts by weight, still more preferably 5 to 15 parts by weight, and particularly preferably 10 to 15 parts by weight with respect to 100 parts by weight of aluminum in the additive particles. By limiting the proportions of the contents of aluminum and silicon in the additive particles to these specific ranges, the conductive paste can reliably form electrodes in crystalline silicon solar cells at low cost while ensuring that the electrodes exhibit low contact resistance with respect to both p-type and n-type impurity diffusion layers.

In the additive particles present in the conductive paste of the invention, the material of the additive particles is preferably zinc-aluminum alloy. In the zinc-aluminum alloy as the material of the additive particles, the content of zinc is preferably 0.1 to 500 parts by weight, more preferably 0.1 to 20 parts by weight, still more preferably 1 to 10 parts by weight, and particularly preferably 2 to 8 parts by weight with respect to 100 parts by weight of aluminum in the additive particles. By limiting the proportions of the contents of aluminum and zinc in the additive particles to these specific ranges, the conductive paste can reliably form electrodes in crystalline silicon solar cells at low cost while ensuring that the electrodes exhibit low contact resistance with respect to both p-type and n-type impurity diffusion layers.

In the conductive paste of the invention, the amount of the additive particles containing 20 to 98 mass % aluminum is preferably 2 to 30 parts by weight, and more preferably 3 to 20 parts by weight with respect to 100 parts by weight of the silver powder. By containing the specific amount of the additive particles in addition to a specific glass frits, the conductive paste of the invention can form electrodes at low cost while ensuring that the electrodes exhibit low contact resistance with respect to both p-type diffusion layers and n-type diffusion layers in which p-type and n-type impurities are diffused.

The conductive paste of the invention includes glass frits.

The conductive paste of the invention is characterized in that the glass transition point of the glass frits is 150 to 440° C., preferably 150 to 430° C., and more preferably 150 to 300° C. By containing the glass frits with the specific glass transition point in addition to the specific additive particles, the conductive paste of the invention can form electrodes at low cost while ensuring that the electrodes exhibit low contact resistance with respect to both p-type diffusion layers and n-type diffusion layers in which p-type and n-type impurities are diffused. The glass transition point may be measured by a differential thermal analysis method.

The conductive paste of the invention preferably includes the glass frits in an amount of 0.1 to 10 parts by weight, and more preferably 0.5 to 8 parts by weight with respect to 100 parts by weight of the silver powder. By limiting the amount of the glass frits to this specific range, the conductive paste of the invention can reliably form electrodes in crystalline silicon solar cells at low cost while ensuring that the electrodes exhibit low contact resistance with respect to both p-type and n-type impurity diffusion layers.

The glass frits present in the conductive paste of the invention is preferably one that includes silver oxide and vanadium oxide and has a glass transition point in the specific range (in the specification, written simply as the "glass frit A").

When the glass frits present in the conductive paste of the invention includes silver oxide and vanadium oxide, the conductive paste of the invention can form electrodes on p-type and n-type impurity diffusion layers in crystalline silicon solar cells while ensuring that the electrodes exhibit low contact resistance with respect to both types of diffusion layers.

In the conductive paste of the invention, it is preferable that the silver oxide and the vanadium oxide present in the glass frit A be $Ag_2O$ and $V_2O_5$. When the glass frit A includes the silver oxide $Ag_2O$ and the vanadium oxide $V_2O_5$, good electrical connections (contacts) may be reliably obtained between the electrodes and the p-type and n-type impurity diffusion layers (hereinafter, these layers will be also written simply as the "emitter layers").

In addition to the silver oxide (A) and the vanadium oxide (B), the glass frit A may include at least one first oxide (C) (also written as "component (C)") selected from the group consisting of $MoO_3$, $ZnO$, $CuO$, $TiO_2$, $Bi_2O_3$, $MnO_2$, $MgO$, $Nb_2O_5$, $BaO$ and $P_2O_5$.

The component(s) (C) present in the glass frit A includes at least one first oxide selected from the group consisting of $MoO_3$, $ZnO$, $CuO$, $TiO_2$, $Bi_2O_3$, $MnO_2$, $MgO$, $Nb_2O_5$, $BaO$ and $P_2O_5$, and may include two or more kinds of the first oxides, or three or more kinds of the first oxides.

When the glass frit A includes two or more kinds of the first oxides as the components (C), the components (C) are preferably $MoO_3$ and $ZnO$, or $MoO_3$ and $CuO$.

When the glass frit A includes three or more kinds of the first oxides as the components (C), the components (C) are preferably $MoO_3$, $ZnO$ and $CuO$.

The glass frit A may further include at least one second oxide (D) as an additional raw material selected from the group consisting of $SiO_2$, $Al_2O_3$, $SnO$, $WO_3$ and $Fe_2O_3$ (hereinafter, also written as the "component (D)"). By containing the second oxide as the component (D) in the glass frit A, a more complicated eutectic crystal is formed and an appropriate degree of crystallization without being excessively crystallized is progressed. Further, after effective bonding of an adherend, when the electronic device (solar cell) including the adherend may be subjected to thermal cycles, it is possible to prevent problems such as cracks occurring due to a mismatch in expansion coefficient between the adherend and the crystallized glass structure. As a result, the electrodes exhibit a high resistance to thermal stress and can maintain high adhesion.

The glass frit A is preferably composed of (A) $Ag_2O$, (B) $V_2O_5$ and (C) at least one first oxide selected from the group consisting of $MoO_3$, $ZnO$, $CuO$, $TiO_2$, $Bi_2O_3$, $MnO_2$, $MgO$, $Nb_2O_5$, $BaO$ and $P_2O_5$.

The glass frit A is preferably composed of (A) $Ag_2O$, (B) $V_2O_5$ and (C) two kinds of first oxides selected from the group consisting of $MoO_3$, $ZnO$, $CuO$, $TiO_2$, $Bi_2O_3$, $MnO_2$, $MgO$, $Nb_2O_5$, $BaO$ and $P_2O_5$.

The glass frit A is preferably composed of (A) $Ag_2O$, (B) $V_2O_5$, (C) at least one first oxide selected from the group consisting of $MoO_3$, $ZnO$, $CuO$, $TiO_2$, $Bi_2O_3$, $MnO_2$, $MgO$, $Nb_2O_5$, $BaO$ and $P_2O_5$, and (D) at least one second oxide selected from the group consisting of $SiO_2$, $Al_2O_3$, $SnO$, $WO_3$ and $Fe_2O_3$.

In order to achieve excellent adhesion at low temperatures (for example, 500° C. and below) and excellent thermal stress resistance during thermal cycles after bonding, it is preferable that the glass frit A is composed of (A) $Ag_2O$, (B) $V_2O_5$ and (C) $MoO_3$.

The glass frit A that is a particularly preferred glass frit for use in the inventive conductive paste used in the formation of solar cell electrodes will be described in detail. The glass frit A present in the electrode-forming conductive paste of the invention preferably further includes at least one selected from molybdenum oxide and zinc oxide, in addition to silver oxide and vanadium oxide. More preferably, the glass frit A in the inventive conductive paste further includes both molybdenum oxide and zinc oxide, in addition to silver oxide and vanadium oxide. The molybdenum oxide and the zinc oxide are preferably $MoO_3$ and $ZnO$.

When the glass frit A additionally contains at least one selected from molybdenum oxide and zinc oxide, the obtainable electrodes may establish good electrical contacts with emitter layers more reliably. When the glass frit A additionally contains both molybdenum oxide and zinc oxide, the obtainable electrodes may establish good electrical contacts with emitter layers still more reliably.

In the conductive paste of the invention, the glass frit A preferably includes silver oxide at 50 to 70 wt % in terms of $Ag_2O$ and vanadium oxide at 20 to 35 wt % in terms of $V_2O_5$ with respect to the total weight of the glass frit A taken as 100 wt %. Further, the glass frit A in the conductive paste of the invention preferably includes molybdenum oxide at 4 to 12 wt % in terms of $MoO_3$ and zinc oxide at 1 to 10 wt % in terms of ZnO with respect to the total weight of the glass frit taken as 100 wt %. This composition of the glass frit A ensures that the obtainable electrodes establish good electrical contacts with emitter layers highly reliably.

The glass frit A present in the conductive paste of the invention may include silver oxide, vanadium oxide, molybdenum oxide and zinc oxide. The glass frit A is preferably composed of four kinds of oxides: silver oxide, vanadium oxide, molybdenum oxide and zinc oxide. More preferably, the glass frit A is composed of the silver oxide $Ag_2O$, the vanadium oxide $V_2O_5$, the molybdenum oxide $MoO_3$ and the zinc oxide ZnO. When the glass frit A is composed of the above four kinds of oxides, the obtainable conductive paste can reliably provide good electrical contacts between the electrodes and emitter layers.

When the glass frit A is composed of the silver oxide $Ag_2O$, the vanadium oxide $V_2O_5$, the molybdenum oxide $MoO_3$ and the zinc oxide ZnO, it is preferable that the content of the silver oxide is 54.8 to 66.4 wt %, the content of the vanadium oxide is 21.4 to 30.7 wt %, the content of the molybdenum oxide is 4 to 12 wt %, and the content of the zinc oxide is 1 to 10 wt % with respect to the glass frit A taken as 100 wt %. The above composition of the four kinds of oxides present in the glass frit A ensures that the four kinds of oxides may be melted at relatively low temperatures and the glass frit A composed of the four kinds of oxides may be produced relatively easily. A specific example of the composition of the glass frit A is 56.2 wt % of $Ag_2O$, 25.8 wt % of $V_2O_5$, 10.0 wt % of $MoO_3$ and 8.0 wt % of ZnO.

Another configuration of the glass frits used in the conductive paste of the invention will be described. The glass frit present in the conductive paste of the invention may be one that includes at least one selected from boron oxide ($B_2O_3$), silicon oxide ($SiO_2$) and lead oxide (PbO) and has a glass transition point in the specific range (in the specification, simply written as the "glass frit B"). The glass frit used in the conductive paste of the invention may be a combination of the aforementioned glass frit A and the glass frit B.

When the glass frit in the conductive paste of the invention includes the glass frit B including at least one selected from boron oxide ($B_2O_3$), silicon oxide ($SiO_2$) and lead oxide (PbO), the etching action of the glass frit B with respect to natural oxide films may be used. Thus, the conductive paste that includes the glass frit B having a glass transition point in the specific range can achieve a decrease in contact resistance between the electrodes and emitter layers and can provide good solar cell characteristics.

The glass frit B present in the conductive paste of the invention preferably includes silicon dioxide ($SiO_2$). The content of $SiO_2$ in the glass frit is preferably 5 to less than 50 wt %, more preferably 7 to 47 wt %, and still more preferably 10 to 40 wt %. This content of $SiO_2$ in the glass frit B ensures that crystalline silicon solar cells having good solar cell characteristics may be obtained reliably.

To ensure that the above action of the glass frit B may be obtained reliably, it is preferable that the glass frit B include at least one selected from lead oxide (PbO) and boron oxide ($B_2O_3$).

The glass frit B present in the electrode-forming conductive paste of the invention may be a glass frit B containing lead or a Pb-free glass frit B containing no lead. In order to ensure that the use of the conductive paste of the invention provides an enhancement in the conversion efficiency of crystalline silicon solar cells, it is preferable to use a glass frit B including PbO. In order to reliably obtain crystalline silicon solar cells having higher conversion efficiency, the content of PbO in the glass frit B is preferably 50 to 95 wt %, and more preferably 60 to 85 wt %.

The content of $B_2O_3$ in the glass frit B is 0 to 40 wt %, preferably 0 to 15 wt %, and more preferably 0 to 5 wt %. This content of $B_2O_3$ in the glass frit B ensures that crystalline silicon solar cells having good solar cell characteristics may be obtained reliably.

To ensure that the above action of the glass frit B may be obtained more reliably, it is preferable that the glass frit B be lead borosilicate glass frit.

When the glass frit A and the glass frit B are used in combination, the glass frit B may be melted together with the glass frit A to give a glass frit that includes components derived from the lead borosilicate glass frit and the glass frit A and has a glass transition point in the prescribed range. However, because the actions of the glass frit A and the glass frit B during firing are not exactly the same, it is preferable to use the glass frit A and the glass frit B as individual glass frit particles in order to facilitate the control of the actions of the two kinds of glass frits. In any case, the glass transition point of the glass frit should be in the prescribed temperature range.

The glass frit in the conductive paste of the invention may include any oxides other than the aforementioned oxides while ensuring that the glass frit has the prescribed glass transition point. For example, the glass frit in the conductive paste of the invention may appropriately include oxides selected from, for example, $Bi_2O_3$, BaO, $Al_2O_3$, $P_2O_5$, CaO, MgO, $ZrO_2$, $TiO_2$, $Li_2O_3$, $Na_2O_3$, ZnO, $CeO_2$, $SnO_2$ and SrO. These oxides may be present as components in the glass frit A and/or the glass frit B, or may be present as individual glass frit particles separate from the glass frit A and the glass frit B. In any case, the glass transition point of the glass frit should be in the prescribed temperature range.

The shape of the particles of the glass frit is not particularly limited and may be, for example, any of spheres and amorphous shapes. Further, the particle size is not particularly limited. From points of view such as workability, the average value (D50) of the particle sizes is preferably in the range of 0.1 to 10 μm and more preferably in the range of 0.5 to 5 μm.

For example, glass frits which may be used in the conductive paste of the invention may be produced by the following method.

First, powders of oxides as raw materials are weighed and mixed together, and the mixture is added to a crucible. The crucible is placed into a hot oven and the temperature (of the mixture in the crucible) is raised to the melt temperature. The raw materials are held at the melt temperature until they are melted sufficiently. Next, the crucible is removed from the oven and the melt is stirred uniformly. The melt in the crucible is then rapidly cooled at room temperature with use of two stainless steel rolls, thereby forming a glass plate. Lastly, the glass plate is crushed in a mortar to give uniformly dispersed particles, which are then sieved through mesh screens to afford a glass frit having a desired particle size. A glass frit having an average particle diameter (median diameter D50) of 149 μm may be obtained by collecting particles passed through a 100 mesh sieve and retained on a 200 mesh sieve. The size of the glass frit is not limited to the one described above, and the glass frit may have a larger average particle diameter or a smaller average particle diameter depending on the size of the meshes in the sieve. The above glass frit is further crushed to obtain a desired average particle diameter (D50) of the glass frit.

The conductive paste of the invention includes an organic vehicle.

The organic vehicle present in the conductive paste of the invention may include an organic binder and a solvent. The organic binder and the solvent have roles such as to control the viscosity of the conductive paste, and any such components may be used without limitation. The organic binder may be used as a solution in a solvent.

The organic binder may be selected from cellulose resins (for example, ethylcellulose and nitrocellulose) and (meth) acrylic resins (for example, polymethyl acrylate and polymethyl methacrylate). The amount of the organic binder is usually 0.2 to 30 parts by weight, and preferably 0.4 to 5 parts by weight with respect to 100 parts by weight of the conductive powder.

The solvent may be one, or two or more selected from alcohols (for example, terpineol, α-terpineol and β-terpineol) and esters (for example, hydroxyl group-containing esters, 2,2,4-trimethyl-1,3-pentanediol monoisobutyrate and butylcarbitol acetate). The amount of the solvent is usually 0.5 to 30 parts by weight, and preferably 5 to 25 parts by weight with respect to 100 parts by weight of the conductive powder.

The conductive paste of the invention may optionally include additives selected from, for example, plasticizers, anti-foaming agents, dispersants, leveling agents, stabilizers and adhesion improvers. Of these, the plasticizers may be selected from, for example, phthalate esters, glycolate esters, phosphate esters, sebacate esters, adipate esters and citrate esters.

Next, there will be described a method for producing the conductive paste of the invention.

The method for producing the conductive paste of the invention includes a step of mixing the conductive powder, the glass frit and the organic vehicle together. The conductive paste of the invention may be produced by admixing the conductive powder, the glass frit and optionally the additives and the additive particles to the organic binder and the solvent, and stirring the mixture to form a dispersion.

For example, the mixing may be performed with a planetary mixer, and the dispersing may be performed with a three-roll mill. The mixing and dispersing methods are not limited thereto, and various known methods may be used.

Another aspect of the invention resides in a method for manufacturing crystalline silicon solar cells using the aforementioned conductive paste.

The method for manufacturing crystalline silicon solar cells of the invention includes steps of printing the aforementioned conductive paste of the invention onto a diffusion layer including n-type or p-type silicon in a crystalline silicon substrate, and drying and firing the conductive paste to form an electrode. Hereinbelow, the solar cell manufacturing method of the invention will be described in further detail with reference to FIGS. 1 and 2.

FIG. 1 is a schematic sectional view illustrating a back-contact crystalline silicon solar cell. In the case of a back-contact solar cell, both positive and negative electrodes (a positive electrode 5a and a negative electrode 5b) are disposed on the backside surface of the solar cell (the surface opposite to the light incident surface). The positive electrode 5a and the negative electrode 5b are disposed in contact with a p-type diffusion layer (a p-type silicon layer) 3 and an n-type diffusion layer (an n-type silicon layer) 4 formed in comb-like patterns so that the teeth of the combs are arranged alternately. Prior to the formation of the positive electrode 5a and the negative electrode 5b, a backside passivation layer 6 may be formed on the backside surface of an n-type silicon substrate 1b having the p-type diffusion layer 3 and the n-type diffusion layer 4. In this manner, the recombination of carriers (conduction electrons and holes) during electrical production may be prevented and the conversion efficiency may be enhanced. The backside passivation layer 6 has openings to allow the positive electrode 5a and the negative electrode 5b to be in contact with the p-type diffusion layer 3 and the n-type diffusion layer 4. An antireflection layer 2 is arranged on the surface (the light incident surface) of the solar cell. In this manner, the loss in efficiency due to the surface reflection of incident light may be reduced. Some types of the antireflection layers 2 may also serve as surface passivation films.

In the method for manufacturing a back-contact crystalline silicon solar cell illustrated in FIG. 1, first, an n-type silicon substrate 1b is provided. On one surface (the backside surface) of the n-type silicon substrate 1b, a p-type diffusion layer 3 and an n-type diffusion layer 4 are formed each in a comb-like pattern so that the teeth of the combs are arranged alternately. Specifically, the p-type diffusion layer 3 and the n-type diffusion layer 4 are formed on the backside surface in alternately interdigitated patterns. Next, an antireflection layer is formed by depositing a material such as silicon nitride by a method such as plasma CVD onto the light incident surface of the substrate. At the same time as the formation of the antireflection layer, a backside passivation layer 6 may be formed. In the backside passivation layer 6, contact holes for establishing electrical contacts with the p-type diffusion layer 3 and the n-type diffusion layer 4 are formed.

In the method for manufacturing a back-contact crystalline silicon solar cell of the invention, next, steps are performed in which the aforementioned conductive paste of the invention is printed onto the diffusion layers including n-type or p-type silicon in the crystalline silicon substrate, and the conductive paste is dried and fired to form electrodes.

Specifically, the electrode-forming steps are performed in such a manner that the conductive paste of the invention is printed onto the diffusion layers including n-type or p-type silicon in the crystalline silicon substrate by a method such as a screen printing method. Because the conductive paste may be used to form both the positive electrode 5a and the negative electrode 5b, a pattern of the positive electrode 5a and that of the negative electrode 5b may be formed by subjecting the conductive paste to one pass of the screen printing step.

In the electrode-forming steps, next, the screen printed electrode patterns are dried and are fired at a prescribed temperature to form the positive electrode 5a and the negative electrode 5b. As a result, the positive electrode 5a and the negative electrode 5b form alternately interdigitated electrode patterns on the p-type diffusion layer 3 and the n-type diffusion layer 4.

The electrode patterns formed by the screen printing of the conductive paste may be dried at a temperature of about 100 to 150° C. for several minutes (for example, 0.5 to 5 minutes).

Thereafter, the dried patterns of the conductive paste are fired in the air at a prescribed firing temperature for 0.4 to 3 minutes using a firing furnace such as a tubular furnace, and thereby the front surface electrode 15b on the light incident surface and the back surface electrode 15a are formed. Specifically, the firing temperature is preferably 400 to 700° C., and more preferably 400 to 650° C. The firing time from IN to OUT from the firing furnace may be 0.5 minutes. The firing conditions are not limited to those described above and may be selected appropriately. In order to increase the degree of freedom of the firing conditions, the conductive paste is preferably such that the desired performance may be obtained by firing at a temperature in the range of 400 to 700° C., and preferably 400 to 650° C.

In the manner described above, a back-contact crystalline silicon solar cell illustrated in FIG. 1 may be manufactured. That is, a back-contact crystalline silicon solar cell of the invention may be thus manufactured.

Next, a method for manufacturing a solar cell having a structure illustrated in FIG. 2 will be described.

FIG. 2 is a schematic sectional view illustrating a crystalline silicon solar cell having electrodes (a front surface electrode 15b and a back surface electrode 15a) on both the light incident surface and the backside surface. Specifically, a vicinity of the front surface electrode 15b is illustrated. The crystalline silicon solar cell shown in FIG. 2 has the front surface electrode 15b disposed on the light incident surface, an antireflection layer 2, an n-type diffusion layer (an n-type silicon layer) 3, a p-type silicon substrate 1a and the back surface electrode 15a.

In the method for manufacturing the solar cell illustrated in FIG. 2, the conductive paste of the invention may be used to form both the front surface electrode 15b and the back surface electrode 15a on the solar cell substrate, because the conductive paste of the invention can form electrodes (the front surface electrode 15b and the back surface electrode 15a) that exhibit low contact resistance with respect to both the p-type diffusion layer 3 and the n-type diffusion layer 4.

In the production of the solar cell having a structure illustrated in FIG. 2, the conductive paste of the invention may be applied by a method such as a screen printing method to print an electrode pattern on the crystalline silicon substrate having the n-type diffusion layer 4 on its surface, or on the antireflection layer 2 disposed on the n-type diffusion layer 4.

The solar cell manufacturing method of the invention includes steps of drying and firing the print of the electrode-forming conductive paste. Specifically, first, the printed electrode pattern is dried at a temperature of about 100 to 150° C. for several minutes (for example, 0.5 to 5 minutes). The conductive paste of the invention is printed onto substantially the entirety of the backside surface and is dried in the similar manner.

Thereafter, the dried prints of the conductive paste are fired in the air using a firing furnace such as a tubular furnace under firing conditions similar to those in the production of the back-contact crystalline silicon solar cells. In this case too, it is preferable that the firing temperature be 400 to 700° C., and more preferably 400 to 650° C.

By the manufacturing method described above, the solar cell having a structure illustrated in FIG. 2 may be produced.

According to the aforementioned method for manufacturing crystalline silicon solar cells using the inventive conductive paste, crystalline silicon solar cells may be obtained in which the electrodes show a contact resistance of not more than 100 mΩ·cm, and preferably not more than 10 mΩ·cm. Electrodes having a contact resistance exceeding 100 mΩ·cm are hardly usable as electrodes in solar cells. Crystalline silicon solar cells having a good performance may be obtained by forming electrodes using the conductive paste of the invention.

The crystalline silicon solar cells produced by the manufacturing method of the invention are preferably so-called back-contact solar cells in which diffusion layers including n-type and p-type silicons are disposed on the backside surface of a crystalline silicon substrate opposite to the light incident surface. In the production of back-contact solar cells by the manufacturing method of the invention, the positive electrode 5*a* and the negative electrode 5*b* may be formed using the same conductive paste. As a result, the number of screen printing steps required to form the electrodes may be reduced to one time, and thus the costs associated with the manufacturing of solar cells may be advantageously reduced. Accordingly, the inventive method for manufacturing crystalline silicon solar cells may be suitably used for the manufacturing of back-contact solar cells.

In order to achieve high conversion efficiency, it is preferable that the light incident surface of the crystalline silicon substrates illustrated in FIGS. 1 and 2 have a pyramid texture structure.

While the above description has illustrated the solar cell in FIG. 1 as having an n-type silicon substrate and the solar cell in FIG. 2 as having a p-type silicon substrate, it is also possible to use a p-type silicon substrate in the solar cell in FIG. 1 and to use an n-type silicon substrate in the solar cell in FIG. 2 while arranging appropriate diffusion layers. It is because the conductive paste of the invention can form electrodes that exhibit low contact resistance with respect to both p-type diffusion layers and n-type diffusion layers.

EXAMPLES

Hereinbelow, the present invention will be described in detail based on Examples without limiting the scope of the invention to such Examples.

In Examples, conductive pastes of the invention were screen printed onto silicon substrates having prescribed diffusion layers to form contact resistance measurement patterns, which were dried and fired to form contact resistance measurement electrodes. In Examples, the contact resistance between the electrodes formed and the diffusion layers in the silicon substrates was measured to determine the usability of the conductive pastes of the invention.

<Materials and Formulations Used in Preparation of Conductive Pastes>

The compositions of conductive pastes used in Examples and Comparative Examples are described in Tables 1 to 3. Details of the components are described below.

Silver powder: Ag (100 parts by weight) spheres having a BET value of 1.0 $m^2/g$ and an average particle diameter D50 of 1.4 μm were used.

Additive particles: The types of additive particles used and the amounts of the additive particles with respect to 100 parts by weight of the silver powder are described in Tables 1 to 3 and 8. Details of the additive particles described in Tables 1 to 3 are given in Table 4. Three types of particles SiAl-1, SiAl-2 and SiAl-3 in Table 4 are additive particles made of silicon-aluminum alloy. Details of the additive particles described in Table 8 are given in Table 9. Two types of particles ZnAl-1 and ZnAl-2 in Table 8 are additive particles made of zinc-aluminum alloy.

Organic binder: Products having an ethoxy content of 48 to 49.5 wt % were used as ethylcellulose (2 parts by weight). Specifically, STD4 (0.5 parts by weight), EM70 (0.5 parts by weight) and STD200 (1.0 part by weight) were used. Respective solutions in butylcarbitol with an ethylcellulose content of 15 parts by weight are used.

Plasticizer: Oleic acid (0.2 parts by weight) was used.

Solvent: Butylcarbitol (5 parts by weight) was used.

Glass frits: The types of glass frits (GF-1 to GF-7) used and the amounts of the glass frits with respect to 100 parts by weight of the silver powder are described in Tables 1 to 3 and 8. Details of the glass frits GF-1 to GF-7 described in Tables 1 to 3 and 8 are given in Table 5. In Table 5, for example, the composition of GF-1 "$Ag_2O$-$V_2O_5$-$MoO_3$-$ZnO$" indicates that the components of the glass frit include $Ag_2O$, $V_2O_5$, $MoO_3$ and $ZnO$. As described in Table 5, the glass transition points of the glass frits GF-1 to GF-6 are not more than 440° C. On the other hand, the glass transition point of the glass frit GF-7 used in Comparative Examples is 442° C. The average particle diameter D50 of the glass frits was 2 μm.

The glass frits were produced by the following method. Powders of the raw material oxides described in Table 5 were weighed and mixed together, and the mixture was added to a crucible. The compositions of the glass frits GF-1 and GF-2 are shown as examples in FIGS. 6 and 7. The crucible was placed into a hot oven and the temperature (of the mixture in the crucible) was raised to the melt temperature. The raw materials were held at the melt temperature until they were melted sufficiently. Next, the crucible was removed from the oven and the melt was stirred uniformly. The melt in the crucible was then rapidly cooled at room temperature with use of two stainless steel rolls, thereby forming a glass plate. Lastly, the glass plate was crushed in a mortar to give uniformly dispersed particles, which were then sieved through mesh screens to afford a glass frit having a desired particle size. A glass frit having an average particle diameter (median diameter D50) of 149 μm may be obtained by collecting particles passed through a 100 mesh sieve and retained on a 200 mesh sieve. The glass frit was further crushed to obtain an average particle diameter D50 of 2 μm.

Next, conductive pastes were prepared using the glass frits obtained as described above. Specifically, the aforementioned materials were mixed together in the prescribed formulation with use of a planetary mixer, and were further dispersed with a three-roll mill to give a paste as the conductive paste.

<Fabrication of Contact Resistance Measurement Electrodes>

The conductive pastes of the invention were evaluated by measuring the contact resistance of contact resistance measurement electrodes formed on the surface of crystalline silicon substrates using the conductive pastes prepared above. The contact resistance measurement electrodes were fabricated by the following method.

The substrates were B (boron)-doped P-type monocrystalline silicon substrates (substrate thickness 200 μm).

First, an approximately 20 μm thick silicon oxide layer was formed in the substrate by dry oxidation, and damages on the substrate surface were removed by etching with a solution including hydrogen fluoride, pure water and ammonium fluoride. Further, heavy metals were removed by washing with an aqueous solution including hydrochloric acid and hydrogen peroxide.

Next, the surface of the substrate was treated by a diffusion method using phosphorus oxychloride ($POCl_3$) and thereby phosphorus was diffused at a temperature of 950° C. for 30 minutes so as to form an n-type diffusion layer having a sheet resistance of 30 Ω/square. The contact resistance measurement substrates obtained in this manner were used in the formation of electrodes for the measurement of contact resistance with respect to n-type diffusion layers.

Similarly, the surface of the substrate was treated by a diffusion method using boron trichloride ($BCl_3$) and thereby boron was diffused at a temperature of 1000° C. so as to form a p-type diffusion layer having a sheet resistance of 30 Ω/square. The contact resistance measurement substrates obtained in this manner were used in the formation of electrodes for the measurement of contact resistance with respect to p-type diffusion layers.

Figure 3:
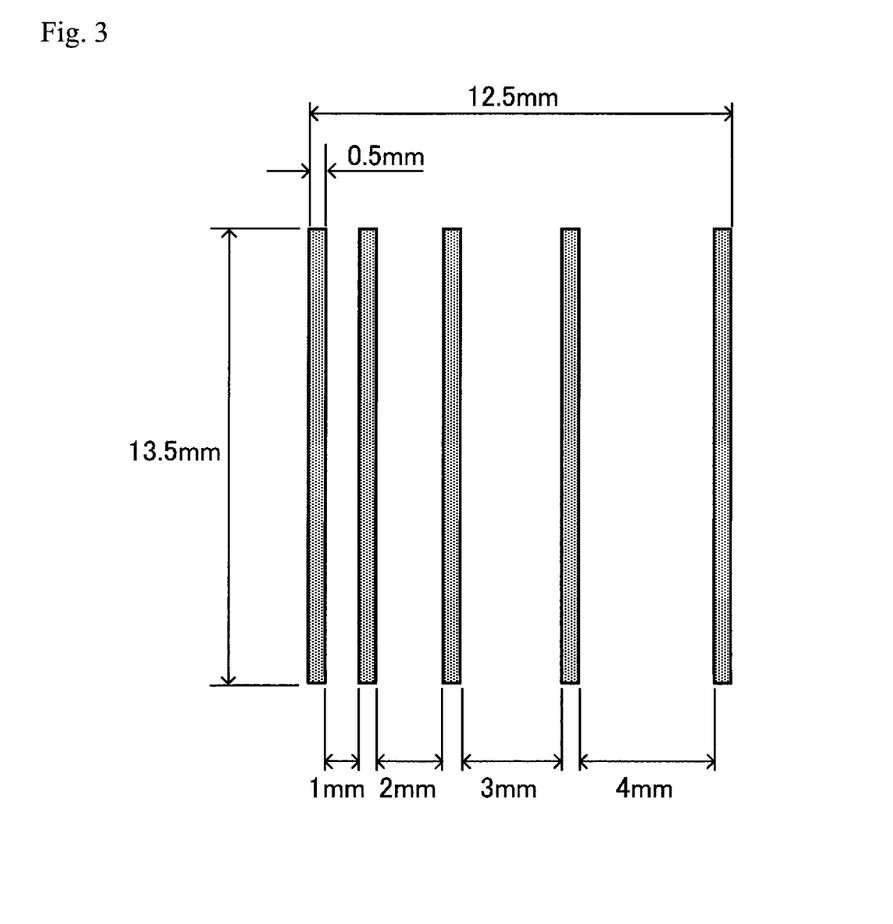
FIG. 3 is a schematic plan view illustrating a contact resistance measurement pattern used in the measurement of contact resistance between an electrode and a substrate.

The conductive pastes were printed onto the contact resistance measurement substrates by a screen printing method. On the substrate, a contact resistance measurement pattern was printed so that the film thickness would be approximately 20 μm, and thereafter the paste was dried at 150° C. for about 60 seconds. As illustrated in FIG. 3, the contact resistance measurement pattern included five rectangular electrode sub-patterns having a width of 0.5 mm and a length of 13.5 mm, and these sub-patterns were arranged at intervals of 1, 2, 3 and 4 mm. The contact resistance was determined by measuring the electrical resistance between a prescribed pair of the rectangular electrode sub-patterns illustrated in FIG. 3 and separating the sheet resistance component from the contact resistance component.

After the contact resistance measurement pattern of the conductive paste had been printed on the surface of the substrate as described above, firing was performed in the air under prescribed conditions using a near infrared firing furnace having a halogen lamp as the heat source (solar cell high-speed firing test furnace manufactured by NGK INSULATORS, LTD.). The firing conditions were such that the peak temperature was the temperature described in Tables 1 to 3 and 8 (written as "Firing temperature" in Tables 1 to 3 and 8), the atmosphere was air, and the firing time from IN to OUT from the firing furnace was 30 seconds. For example, Experiment 4 described in Table 1 shows that samples were produced under four different conditions, in detail, the electrode patterns were formed on the p-type diffusion layers and on the n-type diffusion layers at peak firing temperatures of 580° C. and 630° C. The contact resistance measurement electrodes were fabricated in the manner described above. Three samples were fabricated under the same conditions, and the measurement values of the three samples were averaged.

As mentioned above, the contact resistance was measured with respect to the electrode pattern illustrated in FIG. 3. The electrodes qualify for use in solar cells when the contact resistance is 100 mΩ·cm or below. The electrodes may be suitably used in solar cells when the contact resistance is 10 mΩ·cm or below. The use as solar cell electrodes is difficult if the contact resistance is above 100 mΩ·cm.

As clear from Table 1, the samples of Experiments 1 to 3 which used the conductive pastes containing less than 2 parts by weight of the silicon-aluminum alloy with respect to 100 parts by weight of the silver powder exhibited more than 100 mΩ·cm contact resistance on the p-type diffusion layer and on the n-type diffusion layer under all the conditions. Thus, the conductive pastes used in Experiments 1 to 3 are hardly usable in the formation of electrodes in crystalline silicon solar cells.

In contrast, as clear from Table 1, the samples of Experiments 4 to 8 which used the conductive pastes containing not less than 2 parts by weight of the silicon-aluminum alloy with respect to 100 parts by weight of the silver powder exhibited less than 30 mΩ·cm contact resistance on the p-type diffusion layer and on the n-type diffusion layer under all the conditions. Thus, the conductive pastes used in Experiments 4 to 8 may be used in the formation of electrodes in crystalline silicon solar cells. In particular, the samples of Experiments 5 to 8 which used the conductive pastes containing 6 parts by weight or more of the silicon-aluminum alloy with respect to 100 parts by weight of the silver powder achieved less than 10 mΩ·cm contact resistance on the p-type diffusion layer and on the n-type diffusion layer under all the conditions. With this excellent performance, the conductive pastes used in Experiments 4 to 8 may be suitably used in the formation of electrodes in crystalline silicon solar cells.

As clear from Table 2, the samples of Experiment 9 which used the conductive paste free from glass frit exhibited more than 100 mΩ·cm contact resistance on the p-type diffusion layer and on the n-type diffusion layer when the firing temperature was 580° C. Thus, the conductive paste used in Experiment 9 does not necessarily qualify for use in the formation of electrodes in crystalline silicon solar cells when the firing temperature is in the range of 400 to 700° C.

As clear from Table 2, the samples of Experiment 17 which used the conductive paste containing the glass frit GF-7 with a glass transition point Tg of 442° C. exhibited more than 100 mΩ·cm contact resistance on the p-type diffusion layer when the firing temperature was 580° C., and exhibited more than 100 mΩ·cm contact resistance on the n-type diffusion layer when the firing temperature was 580° C. Thus, the conductive paste used in Experiment 17 does not necessarily qualify for use in the formation of electrodes on p-type diffusion layers in crystalline silicon solar cells when the firing temperature is in the range of 400 to 700° C.

In contrast, as clear from Table 2, the samples of Experiments 10 to 16 which used the conductive pastes containing the glass frits GF-1 to GF-6 with a glass transition point Tg in the range of 150 to 440° C. exhibited less than 100 Ω·cm contact resistance on the p-type diffusion layer and on the n-type diffusion layer under all the conditions. Thus, the conductive pastes used in Experiments 10 to 16 may be used in the formation of electrodes in crystalline silicon solar cells. In particular, the electrodes obtained with the use of the glass frit GF-1 achieved a lower contact resistance. This result suggests that the glass transition point of the glass frit present in the conductive paste of the invention is more preferably 150 to 430° C., and still more preferably 150 to 300° C.

As clear from Table 3, the samples of Experiments 20 to 23 which used the conductive pastes containing 6 parts by weight of Al, AgIn, InSn or AgPd as the additive particles with respect to 100 parts by weight of the silver powder exhibited more than 100 mΩ·cm contact resistance on the p-type diffusion layer and on the n-type diffusion layer under most of the conditions. Thus, the conductive pastes used in Experiments 20 to 23 are hardly usable in the formation of electrodes in crystalline silicon solar cells. In Table 3, "N/A" indicates that the contact resistance was above the measurement limit.

In contrast, as clear from Table 3, the samples of Experiments 18 and 19 which used the conductive pastes containing 6 parts by weight of the silicon-aluminum alloy as the additive particles with respect to 100 parts by weight of the silver powder exhibited less than 10 mΩ·cm contact resistance on the p-type diffusion layer and on the n-type diffusion layer under all the conditions. Thus, the conductive pastes used in Experiments 17 and 18 may be suitably used in the formation of electrodes in crystalline silicon solar cells.

As clear from Table 8, the samples of Experiments 28 to 31 which used the conductive pastes containing less than 2 parts by weight of zinc-aluminum alloy with respect to 100 parts by weight of the silver powder exhibited contact resistances on the p-type diffusion layer and on the n-type diffusion layer that were beyond the measurement limit. In Table 8, "N/A" indicates that the contact resistance was above the measurement limit. Thus, the conductive pastes used in Experiments 28 to 31 are hardly usable in the formation of electrodes in crystalline silicon solar cells.

In contrast, as clear from Table 8, the samples of Experiments 24 to 27 which used the conductive pastes containing 2 to 6 parts by weight of the zinc-aluminum alloy as the additive particles with respect to 100 parts by weight of the silver powder exhibited less than 60 mΩ·cm contact resistance on the p-type diffusion layer and on the n-type diffusion layer under all the conditions. Thus, the conductive pastes used in Experiments 24 to 27 may be used in the formation of electrodes in crystalline silicon solar cells. In particular, the samples of Experiments 24 to 26 in which the additive particles were ZnAl-1 containing 5.7 parts by weight of zinc with respect to 100 parts by weight of aluminum in the additive particles achieved less than 10 mΩ·cm contact resistance on the p-type diffusion layer and on the n-type diffusion layer under all the conditions. With this excellent performance, the conductive pastes used in Experiments 24 to 26 may be suitably used in the formation of electrodes in crystalline silicon solar cells. The results discussed above suggest that while the additive particles present in the conductive paste may contain zinc in 0.1 to 500 parts by weight with respect to 100 parts by weight of aluminum in the additive particles, the zinc content may be preferably 0.1 to 20 parts by weight, more preferably 1 to 10 parts by weight, and particularly preferably 2 to 8 parts by weight.

TABLE 1

| Unit: parts by weight | | Exp. 1 Comp. Ex. | Exp. 2 Comp. Ex. | Exp. 3 Comp. Ex. | Exp. 4 Ex. | Exp. 5 Ex. | Exp. 6 Ex. | Exp. 7 Ex. | Exp. 8 Ex. |
|---|---|---|---|---|---|---|---|---|---|
| Silver powder | | 100 | 100 | 100 | 100 | 100 | 100 | 100 | 100 |
| Glass frits | GF-1 | 2 | 2 | 2 | 2 | 2 | 2 | 2 | 2 |
| | GF-2 | | | | | | | | |
| | GF-3 | | | | | | | | |
| | GF-4 | | | | | | | | |
| | GF-5 | | | | | | | | |
| | GF-6 | | | | | | | | |
| | GF-7 | | | | | | | | |
| Additive particles | Al-1 | | | | | | | | |
| | SiAl-1 | | 0.5 | 1 | 3 | 6 | 10 | 15 | 20 |
| | SiAl-2 | | | | | | | | |
| | SiAl-3 | | | | | | | | |
| | AgIn-1 | | | | | | | | |
| | InSn-1 | | | | | | | | |
| | AgPd-1 | | | | | | | | |
| Contact resistance (mΩ · cm) | Firing temperature | | | | | | | | |
| Contact resistance on n-type diffusion layer (mΩ · cm) | 400° C. | | | | | | | | |
| | 450° C. | | | | | | 8.96 | | |
| | 500° C. | | | | | | 8.98 | | |
| | 580° C. | N/A | 201 | 134 | 15.65 | 8.97 | 8.63 | 8.41 | 7.28 |
| | 600° C. | | | | | | | | |
| | 630° C. | N/A | 193 | 107 | 25.64 | 8.90 | 7.88 | 8.82 | 9.09 |
| | 650° C. | | | | | | | | |
| Contact resistance on p-type diffusion layer (mΩ · cm) | 400° C. | | | | | | | | |
| | 450° C. | | | | | | 5.25 | | |
| | 500° C. | | | | | | 3.21 | | |
| | 580° C. | 1102 | 425 | 358 | 9.17 | 2.51 | 2.06 | 2.53 | 2.61 |
| | 600° C. | | | | | | | | |
| | 630° C. | 623 | 335 | 101 | 13.51 | 2.39 | 1.98 | 2.99 | 3.17 |
| | 650° C. | | | | | | | | |

TABLE 2

| Unit: parts by weight | | Exp. 9 Comp. Ex. | Exp. 10 Ex. | Exp. 11 Ex. | Exp. 12 Ex. | Exp. 13 Ex. | Exp. 14 Ex. | Exp. 15 Ex. | Exp. 16 Ex. | Exp. 17 Comp. Ex. |
|---|---|---|---|---|---|---|---|---|---|---|
| Silver powder | | 100 | 100 | 100 | 100 | 100 | 100 | 100 | 100 | 100 |
| Glass frits | GF-1 | | 6 | 10 | | | | | | |
| | GF-2 | | | | 2 | | | | | |
| | GF-3 | | | | | 2 | | | | |

TABLE 2-continued

| | | | | | | | | | | |
|---|---|---|---|---|---|---|---|---|---|---|
| | GF-4 | | | | | | 2 | | | |
| | GF-5 | | | | | | | 2 | | |
| | GF-6 | | | | | | | | 2 | |
| | GF-7 | | | | | | | | | 2 |
| Additive particles | Al-1 | | | | | | | | | |
| | SiAl-1 | 6 | 6 | 6 | 6 | 6 | 6 | 6 | 6 | 6 |
| | SiAl-2 | | | | | | | | | |
| | SiAl-3 | | | | | | | | | |
| | AgIn-1 | | | | | | | | | |
| | InSn-1 | | | | | | | | | |
| | AgPd-1 | | | | | | | | | |

| Contact resistance ($m\Omega \cdot cm$) | Firing temperature | | | | | | | | | |
|---|---|---|---|---|---|---|---|---|---|---|
| Contact resistance on n-type diffusion layer ($m\Omega \cdot cm$) | 400° C. | | | | | | | | | |
| | 450° C. | | | | | | | | | |
| | 500° C. | | | | | | | | | |
| | 580° C. | 102 | 9.6 | 9.82 | 20.21 | 36.92 | 94.17 | 53.35 | 20.28 | 121 |
| | 600° C. | | | | | | | | | |
| | 630° C. | 18.11 | 15.62 | 46.97 | 13.50 | 21.75 | 40.30 | 21.01 | 16.81 | 78.5 |
| | 650° C. | | | | | | | | | |
| Contact resistance on p-type diffusion layer ($m\Omega \cdot cm$) | 400° C. | | | | | | | | | |
| | 450° C. | | | | | | | | | |
| | 500° C. | | | | | | | | | |
| | 580° C. | 11.07 | 3.47 | 6.01 | 7.81 | 16.56 | 19.96 | 20.02 | 8.24 | 102 |
| | 600° C. | | | | | | | | | |
| | 630° C. | 2.46 | 7.65 | 21.54 | 2.55 | 2.69 | 2.30 | 2.21 | 2.29 | 54.3 |
| | 650° C. | | | | | | | | | |

TABLE 3

| Unit: parts by weight | | Exp. 18 Ex. | Exp. 19 Ex. | Exp. 20 Comp. Ex. | Exp. 21 Comp. Ex. | Exp. 22 Comp. Ex. | Exp. 23 Comp. Ex. |
|---|---|---|---|---|---|---|---|
| Silver powder | | 100 | 100 | 100 | 100 | 100 | 100 |
| Glass frits | GF-1 | 2 | 2 | 2 | 2 | 2 | 2 |
| | GF-2 | | | | | | |
| | GF-3 | | | | | | |
| | GF-4 | | | | | | |
| | GF-5 | | | | | | |
| | GF-6 | | | | | | |
| | GF-7 | | | | | | |
| Additive particles | Al-1 | | | 6 | | | |
| | SiAl-1 | | | | | | |
| | SiAl-2 | | 6 | | | | |
| | SiAl-3 | 6 | | | | | |
| | AgIn-1 | | | | 6 | | |
| | InSn-1 | | | | | 6 | |
| | AgPd-1 | | | | | | 15 |

| Contact resistance ($m\Omega \cdot cm$) | Firing temperature | | | | | | |
|---|---|---|---|---|---|---|---|
| Contact resistance on n-type diffusion layer ($m\Omega \cdot cm$) | 400° C. | | | | | | |
| | 450° C. | | | N/A | 1269.21 | 1049.90 | |
| | 500° C. | | | 111.65 | 1021.12 | | |
| | 580° C. | 9.58 | 9.61 | | | | N/A |
| | 600° C. | | | | 856.31 | N/A | |
| | 630° C. | 8.95 | 8.98 | | | | 846 |
| | 650° C. | | | | 180.46 | 777.09 | |
| Contact resistance on p-type diffusion layer ($m\Omega \cdot cm$) | 400° C. | | | | | | |
| | 450° C. | | | 175.49 | 2654.68 | 2614.95 | |
| | 500° C. | | | 3.14 | 1884.32 | | |
| | 580° C. | 5.83 | 2.59 | | | | 1121 |
| | 600° C. | | | | 1445.48 | 2334.72 | |
| | 630° C. | 2.8 | 2.45 | | | | 821 |
| | 650° C. | | | | 94.37 | N/A | |

TABLE 4

| Nos. of additive particles | Compositions | Shapes | Eutectic temperature (° C.) |
|---|---|---|---|
| Al-1 | Al | Shapes (D50: 4.8 μm) | Melt point: 660° C. |
| SiAl-1 | 12 wt % Si, 88 wt % Al alloy | Spherical powder (D50: 3.5 μm) | 577 |

TABLE 4-continued

| Nos. of additive particles | Compositions | Shapes | Eutectic temperature (° C.) |
|---|---|---|---|
| SiAl-2 | 12 wt % Si, 88 wt % Al alloy | Spherical powder (D50: 7.5 μm) | 577 |
| SiAl-3 | 12 wt % Si, 88 wt % Al alloy | Flake powder | 577 |
| AgIn-1 | 50 wt % Ag, 50 wt % In alloy | Grains (D50: 1.6 μm) | 500 |
| InSn-1 | 50 wt % In, 50 wt % Sn alloy | Spherical aggregated powder (D50: 14.6 μm) | 120 |
| AgPd-1 | 85 wt % Ag, 15 wt % Pd alloy | (D50: 3.1 μm) | |

TABLE 5

| Nos. of glass frits | Compositions | Glass transition point Tg (° C.) | Glass softening point Ts (° C.) |
|---|---|---|---|
| GF-1 | $Ag_2O$—$V_2O_5$—$MoO_3$—$ZnO$ | 168 | — |
| GF-2 | $PbO$—$SiO_2$—$B_2O_3$ | 316 | — |
| GF-3 | $PbO$—$B_2O_3$ | 332 | — |
| GF-4 | $Bi_2O_3$—$B_2O_3$—$ZnO$—$BaO$—$CaO$ | 370 | 405 |
| GF-5 | $SiO_2$—$Al_2O_3$—$B_2O_3$—$Bi_2O_3$—$ZnO$ | — | 425 |
| GF-6 | $SiO_2$—$Al_2O_3$—$B_2O_3$—$Bi_2O_3$—$ZnO$ | 419 | 450 |
| GF-7 | $SiO_2$—$B_2O_3$—$Bi_2O_3$—$ZnO$—$BaO$ | 442 | 515 |

TABLE 6

| Composition of glass frit GF-1 | Proportions (wt %) |
|---|---|
| $Ag_2O$ | 56.2 |
| $V_2O_5$ | 25.8 |
| $MoO_3$ | 10.0 |
| $ZnO$ | 8.0 |
| Total | 100.0 |

TABLE 7

| Composition of glass frit GF-2 (lead borosilicate glass frit) | Proportions (wt %) |
|---|---|
| $B_2O_3$ | 4 |
| $SiO_2$ | 12 |
| $PbO$ | 84 |
| Total | 100 |

TABLE 8

| Unit: parts by weight | | Exp. 24 Ex. | Exp. 25 Ex. | Exp. 26 Ex. | Exp. 27 Ex. | Exp. 28 Comp. Ex. | Exp. 29 Comp. Ex. | Exp. 30 Comp. Ex. | Exp. 31 Comp. Ex. |
|---|---|---|---|---|---|---|---|---|---|
| Silver powder | | 100 | 100 | 100 | 100 | 100 | 100 | 100 | 100 |
| Glass frit | GF-1 | 2 | 2 | 2 | 2 | 2 | 2 | 2 | 2 |
| Additive particles | CuAlFe-1 | | | | | 3 | 6 | 10 | 20 |
| | ZnAl-1 | 2 | 4 | 6 | | | | | |
| | ZnAl-2 | | | | 6 | | | | |
| Contact resistance (mΩ · cm) | Firing temperature | | | | | | | | |
| Contact resistance on n-type Si substrate (mΩ · cm) | 450° C. | | | | | | | | |
| | 500° C. | | | | | | | | |
| | 580° C. | 5.63 | 5.63 | 3.37 | 20.28 | N/A | N/A | N/A | N/A |
| | 600° C. | | | | | N/A | N/A | N/A | N/A |
| | 630° C. | 5.23 | 5.23 | 1.08 | 42.74 | | | | |
| | 650° C. | | | | | | | | |
| Contact resistance on p-type diffusion layer (mΩ · cm) | 450° C. | | | | | | | | |
| | 500° C. | | | | | | | | |
| | 580° C. | 6.61 | 6.61 | 0.14 | 40.98 | N/A | N/A | N/A | N/A |
| | 600° C. | | | | | N/A | N/A | N/A | N/A |
| | 630° C. | 8.18 | 8.18 | 6.65 | 56.78 | | | | |
| | 650° C. | | | | | | | | |

TABLE 9

| Nos. of additive particles | Compositions | Contents of Zn with respect to 100 parts by weight of Al | Shapes | Eutectic temperature (° C.) |
|---|---|---|---|---|
| CuAlFe-1 | Cu 88.9 wt %, Al 9.8 wt %, Fe 11.3 wt % | — | Spherical powder (D50: 4.52 μm) | 1083 |

TABLE 9-continued

| Nos. of additive particles | Compositions | Contents of Zn with respect to 100 parts by weight of Al | Shapes | Eutectic temperature (° C.) |
|---|---|---|---|---|
| ZnAl-1 | Zn—Al alloy Zn 5.4 wt %, Al 94.6 wt % | 5.7 parts by weight | Spherical powder (D50: 6.6 μm) | 650 |
| ZnAl-2 | Zn—Al alloy Zn 75 wt %, Al 25 wt % | 300 parts by weight | Spherical powder (D50: 1.84 μm) | 520 |

REFERENCE SIGNS LIST

1a P-type silicon substrate
1b N-type silicon substrate
2 Antireflection layer
3 P-type diffusion layer
4 N-type diffusion layer
5a Electrode (Positive electrode)
5b Electrode (Negative electrode)
6 Backside passivation layer
15a Back surface electrode
15b Light incident-side electrode (Front surface electrode)

The invention claimed is:

1. A conductive paste for forming a solar cell electrode in a back-contact crystalline silicon solar cell comprising a silver powder, a glass frit, an additive alloy and an organic vehicle,
the glass frit having a glass transition point of 150 to 440° C.,
the additive alloy comprising zinc or silicon and 20 to 98 mass % aluminum,
wherein the additive alloy is contained in an amount of 2 to 20 parts by weight with respect to 100 parts by weight of the silver powder, and
wherein the glass frit includes silver oxide and vanadium oxide.

2. The conductive paste according to claim 1, wherein the the glass frit is contained in an amount of 0.1 to 10 parts by weight with respect to 100 parts by weight of the silver powder.

3. The conductive paste according to claim 1, wherein the additive alloy is a silicon-aluminum alloy.

4. The conductive paste according to claim 3, wherein the silicon-aluminum alloy comprises silicon in an amount of 0.1 to 20 parts by weight with respect to 100 parts by weight of aluminum.

5. The conductive paste according to claim 1, wherein the additive alloy is a zinc-aluminum alloy.

6. The conductive paste according to claim 5, wherein the zinc-aluminum alloy comprises zinc in an amount of 0.1 to 500 parts by weight with respect to 100 parts by weight of aluminum.

7. A method for manufacturing crystalline silicon solar cells comprising:
printing the conductive paste according to claim 1 onto a diffusion layer including an n-type silicon or a p-type silicon in a crystalline silicon substrate; and
forming an electrode by drying and firing the conductive paste.

8. The method for manufacturing crystalline silicon solar cells according to claim 7, wherein forming the electrode comprises firing the conductive paste at 400 to 700° C.

9. The method for manufacturing crystalline silicon solar cells according to claim 7, wherein the diffusion layer including an n-type silicon and a p-type silicon are disposed on a backside surface of the crystalline silicon substrate opposite to a light incident surface.

10. A crystalline silicon solar cell produced by the manufacturing method described in claim 7.

11. The conductive paste according to claim 1, wherein the glass frit further includes $MoO_3$ and ZnO.

* * * * *